United States Patent
Wakamatsu

[11] Patent Number: 5,818,243
[45] Date of Patent: Oct. 6, 1998

[54] IMPEDANCE METER

[75] Inventor: Hideki Wakamatsu, Hyogo, Japan

[73] Assignee: Hewlett-Packard Company, Palo Alto, Calif.

[21] Appl. No.: 859,585

[22] Filed: May 20, 1997

[30] Foreign Application Priority Data

May 30, 1996 [JP] Japan ................................. 8-136405

[51] Int. Cl.$^6$ ............................ G01R 27/08; G01R 27/16
[52] U.S. Cl. ........................ 324/649; 324/654; 324/713; 324/522
[58] Field of Search .................................. 324/638, 648, 324/649, 654, 658, 691, 713, 715, 522, 115, 605, 606, 539, 543

[56] References Cited

U.S. PATENT DOCUMENTS

| | | | |
|---|---|---|---|
| 4,992,740 | 2/1991 | Wakasugi | 324/649 |
| 5,019,781 | 5/1991 | Tanimoto et al. | 324/649 |
| 5,216,373 | 6/1993 | Walamatsu et al. | 324/649 |
| 5,345,182 | 9/1994 | Wakamatsu | 324/649 |
| 5,463,323 | 10/1995 | Wakamatsu | 324/649 |
| 5,532,590 | 7/1996 | Yamanaka | 324/649 |

*Primary Examiner*—Diep N. Do

[57] ABSTRACT

An impedance meter includes a floating type ammeter which measures a voltage across a current detection resistor and determines a current flowing therethrough. A balun eliminates the common mode voltage component in the high frequency range; and a differential amplifier eliminates the common mode voltage component in the low frequency range. The common mode rejection (common mode elimination) effect of the balun and differential amplifier crosses over at a crossover frequency where the impedance of an capacitor and the impedance of the balun are equal. As a result, the impedance meter is capable of measuring a broad range of impedances across a wide range of frequencies, both the low frequency and high frequency range.

12 Claims, 8 Drawing Sheets

IMPEDANCE METER

FIELD OF THE INVENTION

The present invention relates generally to current measurement and, more specifically, an impedance meter that is capable of measuring a wide range of impedances over a wide range of frequencies.

BACKGROUND OF THE INVENTION

Various methods have been proposed in the past to construct an impedance meter that is capable of measuring a wide range of impedances over a wide range of frequencies.

One approach is found in U.S. Pat. No. 5,345,182 (Wakamatsu) which provides an impedance meter capable of measuring impedances over a range of frequencies from 1 MHz to 1 GHz. The impedance meter employs a method of measuring a voltage and a current which allows accurate measurements of impedance to be made over a wide range of impedances (hereinafter referred as voltmeter-ammeter method). FIG. 5 of the present application illustrates a circuit design of the above-noted impedance meter, and FIG. 6 shows an equivalent circuit.

Another approach is found in U.S. Pat. No. 5,463,323 (Wakamatsu), which provides an impedance meter that utilizes coaxial cables and triaxial cables. Such an implementation maintains the advantages of the device disclosed in U.S. Pat. No. 5,345,182, while performing remote measurement. FIGS. 7 and 8 show circuit designs of such a device, and FIGS. 9 and 10 show equivalent circuits.

In the equivalent circuits of FIGS. 6, 9, and 10, the current that passes through a device under test (DUT) 60 (i.e., the object to be measured) is made to flow through a current detection resistor that comprises either one resistor 32 or two resistors 32, 38 in parallel. By measuring the voltage across the current detection resistor (i.e., between the ends of the resistor) with a voltmeter 30, it is possible to measure the current passing through DUT 60. In other words, the current detection resistor and the voltmeter together provide an ammeter. As shown in the equivalent circuits, such an ammeter is commonly referred to as a floating type ammeter that floats the potential from the ground potential.

Referring to FIG. 10, as well as FIGS. 5 and 6, when switch 40 is in the off position, the device can be used to measure a low impedance. This device is not appropriate for measuring a high impedance since the current flowing through an internal resistor 11 of voltmeter 10 also flows through the current detection resistor and the amount thereof is not negligible compared with the current flowing through DUT 60.

In FIGS. 5 and 6, when switch 40 is in the on position, the device can be used to measure a high impedance. FIG. 7 illustrates a circuit design that provides high impedance measurement with remote measurement, for which FIG. 9 is an equivalent circuit. It is known that this circuit design is capable of high impedance measurement.

Referring to FIGS. 5, 7, and 8, the floating type ammeter employs a grounded type of voltmeter 30 and a balun 35. Balun 35 is formed by passing a coaxial cable 36 through a magnetic core or, as shown in FIG. 13, by wrapping a coaxial cable 36 (one or more times) around a magnetic core 70. FIG. 11 shows an equivalent circuit utilizing a balun. At high frequencies, balun 35 has a high exciting impedance. Therefore, even if voltmeter 30 is grounded, it is still possible for the current detection resistor to float the potential from the ground potential.

However, at low frequencies the exciting impedance of balun 35 decreases such that signal generator 20 becomes loaded. In order to extend the lower bound for the operating frequency, it is necessary for balun 35 to have a large core with a large number of turns. However, the length of the winding cable and the size of the core, especially at high frequencies, results in a degradation of the temperature coefficient and a loss of signal strength. Therefore, it has not been possible in practice to maintain the upper bound for the measurement frequency while using a balun to expand the operating frequency into the audio frequency band.

It is also known that floating type ammeter may utilize a differential amplifier to detect the potential difference across the resistor used for measuring the current. FIG. 12 illustrates such an arrangement. Differential amplifiers have recently made it possible to achieve a common mode rejection ratio in excess of 100 dB, thereby creating a floating type ammeter that is ideal for use in impedance measurement devices. However, the utilization of differential amplifiers is limited to low frequency ranges because the common mode rejection ratio becomes worse as the frequency increases. It is difficult to obtain a common mode rejection ratio of 50 dB at 10 MHz, 30 dB at 100 MHz, and even 10 dB at 1 GHz.

In particular, at higher frequencies, the poor common mode rejection ratio results in a current offset value between open measurement terminals 61 and 62 (i.e., open circuit). That is to say, the measured value of the current between open measurement terminals 61 and 62 is no longer zero. Such an offset can be corrected with calculations. However, the common mode rejection ratio varies with the temperature such that it is not possible to predict and, thus, correct for the offset over long periods of time. For the same reason, when the circuit is open between the measurement terminals, the measured value for the admittance has an offset and a measurement error.

In order to measure high impedances, it is necessary to increase the sensitivity of the measurement of the current that flows through the DUT. For this reason, the voltage between the ends of the current detection resistor must be amplified accordingly. However, a large amplification is impossible if the offset of the current zero value is large. In other words, the ability of the impedance meter to measure high impedances is limited to a large extent by the common mode rejection ratio, as explained above.

In general, impedance meters utilizing a balun can obtain stability and extremely high common mode rejection ratios at high frequencies, thus realizing floating type ammeters for high frequencies exceeding 1 GHz. However, such devices are ineffective for low frequencies. On the other hand, differential amplifiers are effective for low frequencies, but not for high frequencies. Therefore, the current methods for measuring high impedances are limited to either high frequency ranges or low frequency ranges.

Accordingly, it is an object of the invention to provide an improved impedance meter that can measure a wide range of impedances over a wide range of frequencies, high frequency and low frequency ranges.

It is a further object of the invention to provide a floating type ammeter having a high common mode rejection ratio over a wide range of frequencies.

It is a further object of the invention to provide an impedance meter that is capable of utilizing a floating type ammeter at high common mode rejection ratios over a wide range of frequencies

SUMMARY OF THE INVENTION

An impedance meter includes a floating type ammeter which measures a voltage between the ends of a current detection resistor and determines a current flowing therethrough. A balun eliminates the common mode voltage component in the high frequency range; and a differential amplifier eliminates the common mode voltage component in the low frequency range. The common mode rejection (common mode elimination) effect of the balun and differential amplifier crosses over at a crossover frequency where the impedance of an capacitor and the impedance of the balun are equal. As a result, the impedance meter is capable of making highly accurate measurements for a wide range of impedances over a wide range of frequencies (i.e., from direct current to the GHz level).

The present invention also provides a means for smoothing out the crossover characteristics. In particular, a resistor is implemented to dampen the resonance consisted of the capacitor and the inductance of the balun at the crossover frequency.

DESCRIPTION OF THE REFERENCE NUMERALS

10: Voltmeter
11: Resistor
12: Coaxial Cable
13: Resistor
20: Signal Generator
21: Resistor
22: Coaxial Cable
30: Voltmeter
31: Differential Amplifier
32: Resistor
33: Capacitor
34: Switch
35: Balun
36: Coaxial Cable
37: Resistor
38: Resistor
40: Switch
51: Coaxial Cable
52: Triaxial Cable
60: Device Under Test (DUT)
61: Measurement Terminal
62: Measurement Terminal
70: Magnetic Core

DETAILED DESCRIPTION OF THE INVENTION

Before proceeding with a detailed description of a referred embodiment of the present invention, it should be noted that the same reference symbols will be used herein for components that are the same as those of the prior art, as shown in FIGS. 5 through 13.

Figure 1:
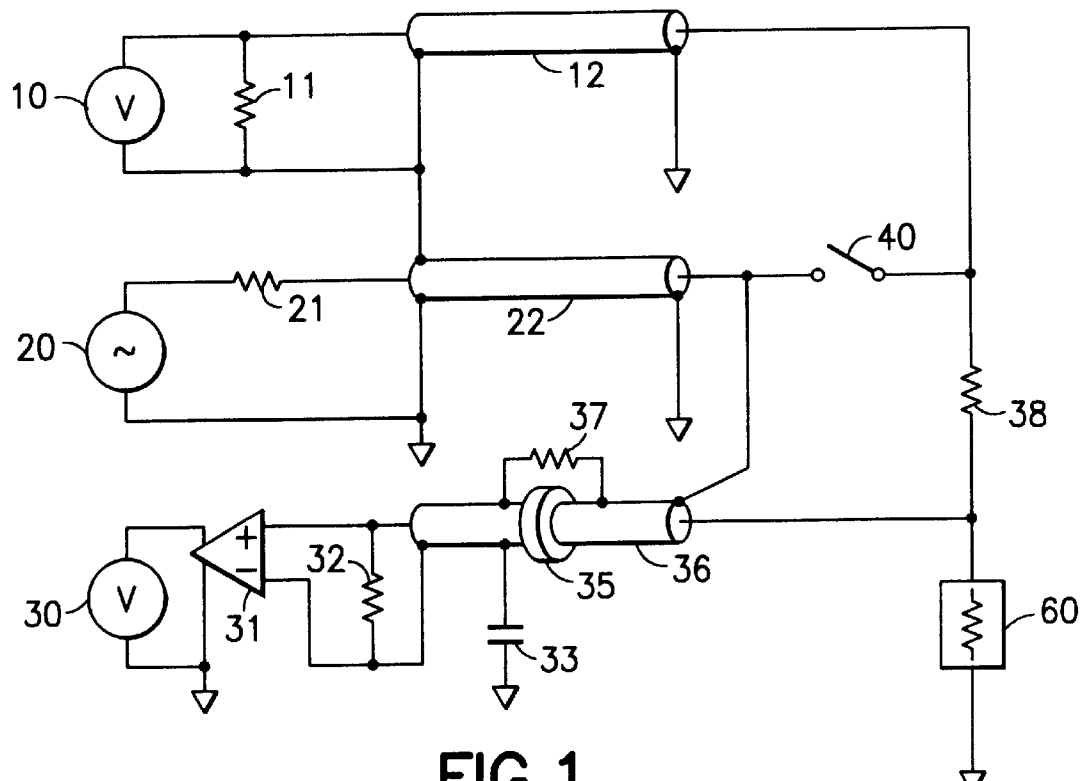
FIG. 1 illustrates a circuit diagram of a first embodiment of an impedance meter, in accordance with the present invention.
Figure 4:
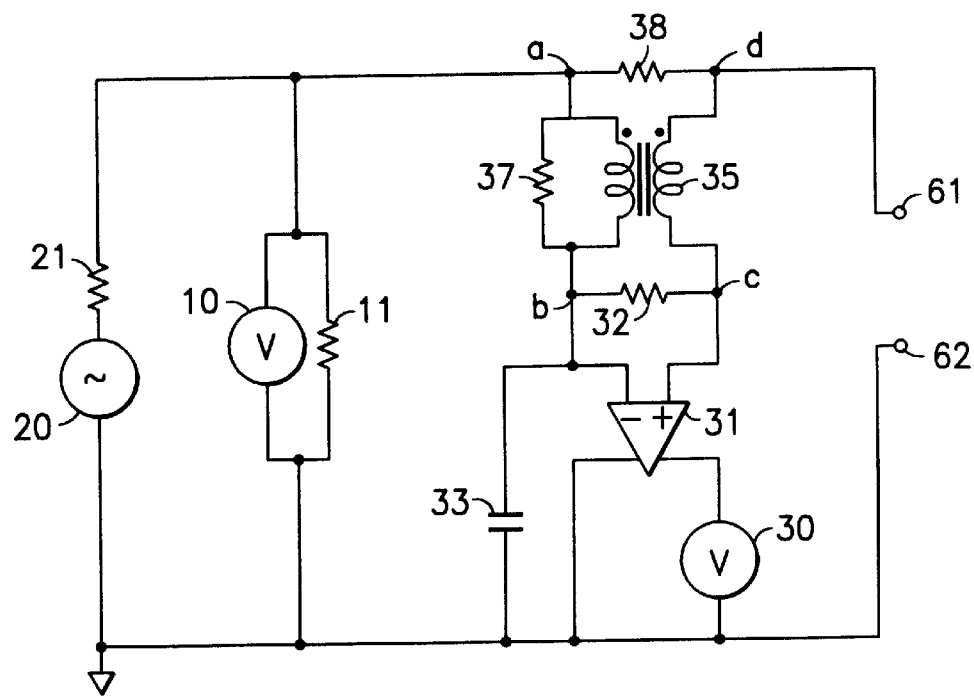
FIG. 4 illustrates an equivalent circuit diagram of the present invention.

Referring to FIGS. 1 and 4, an impedance meter comprises an ammeter which includes a voltmeter 30, a differential amplifier 31, two resistors 32 and 38, and a balun 35 which is formed by winding a coaxial cable 36 around a magnetic core. A resistor 37 is coupled between an input and an output of balun 35 on the outer conductor of the coaxial cable. A capacitor 33 is coupled between the outer conductor of the coaxial cable 36 on the input side of differential amplifier 31 and ground.

The impedance meter further includes a voltmeter 10, a signal generator 20, coaxial cables 12, 22, and a switch 40. Note that while not shown in FIGS. 1 and 4, a calculation/control circuit is employed. The calculation/control block is well known in the art and will not be described in detail herein.

For matching in the high frequency range, resistors 32 and 38 are equal to the characteristic impedance of the coaxial cable. A detailed explanation of this portion is found in U.S. Pat. No. 5,463,323 and will not be described herein.

Figure 2:
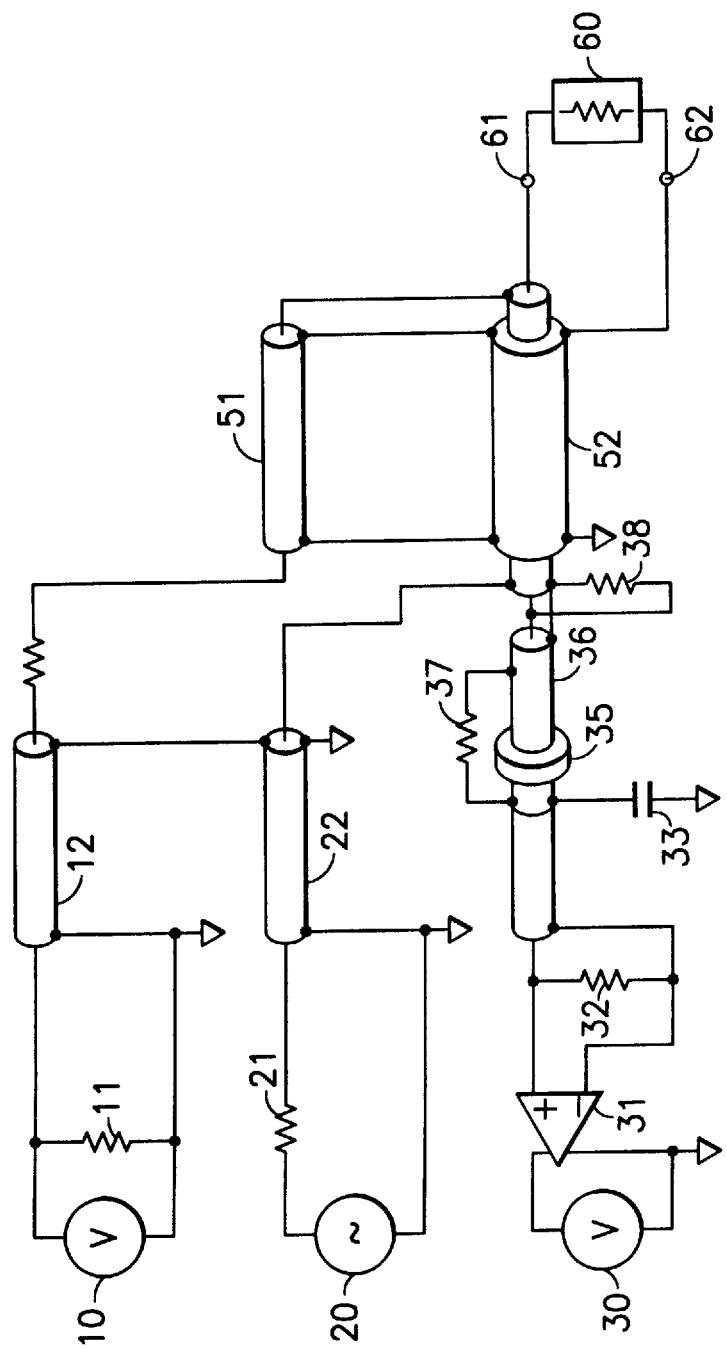
FIG. 2 illustrates a circuit diagram of a second embodiment of an impedance meter, in accordance with the present invention.

FIG. 2 illustrates a second embodiment of the present invention which incorporates features of a device disclosed in U.S. Pat. No. 5,463,323, which is aimed at high impedance measurement. In particular, as compared to the first embodiment (as described above), the second embodiment employs a coaxial cable 51 and a triaxial cable 52 for remote measurement. With regard to the ammeter portion, an equivalent circuit for the second embodiment is illustrated in FIG. 4.

Figure 5:
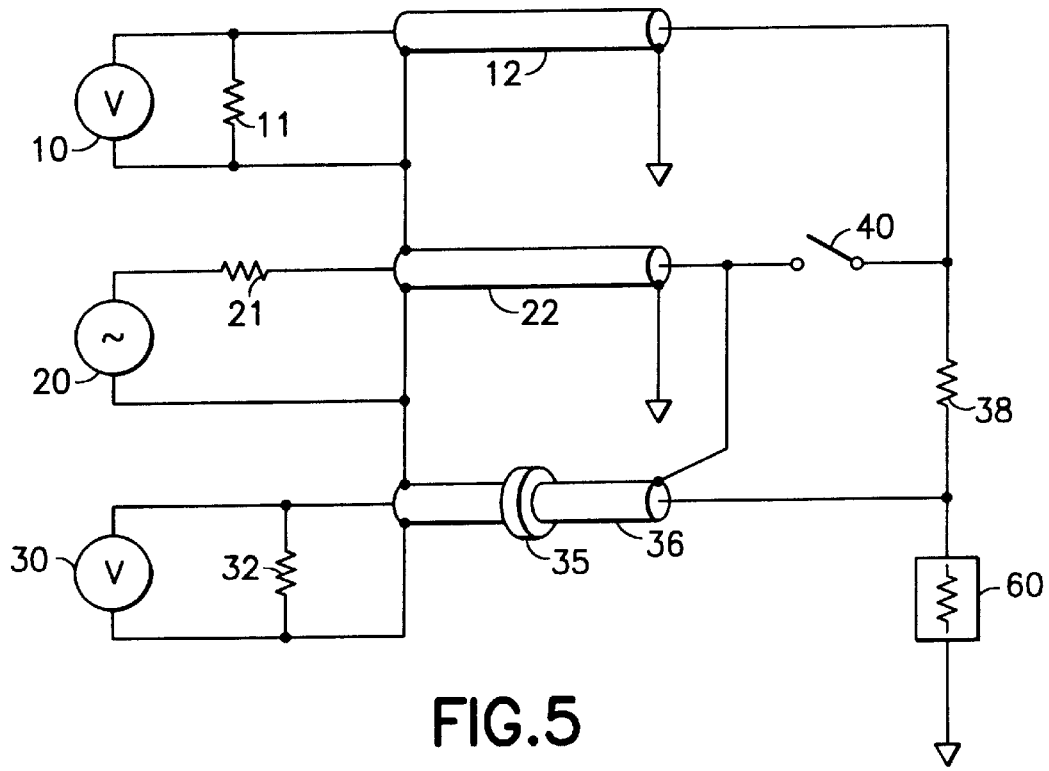
FIG. 5 illustrates an example of an impedance meter of the prior art.
Figure 6:
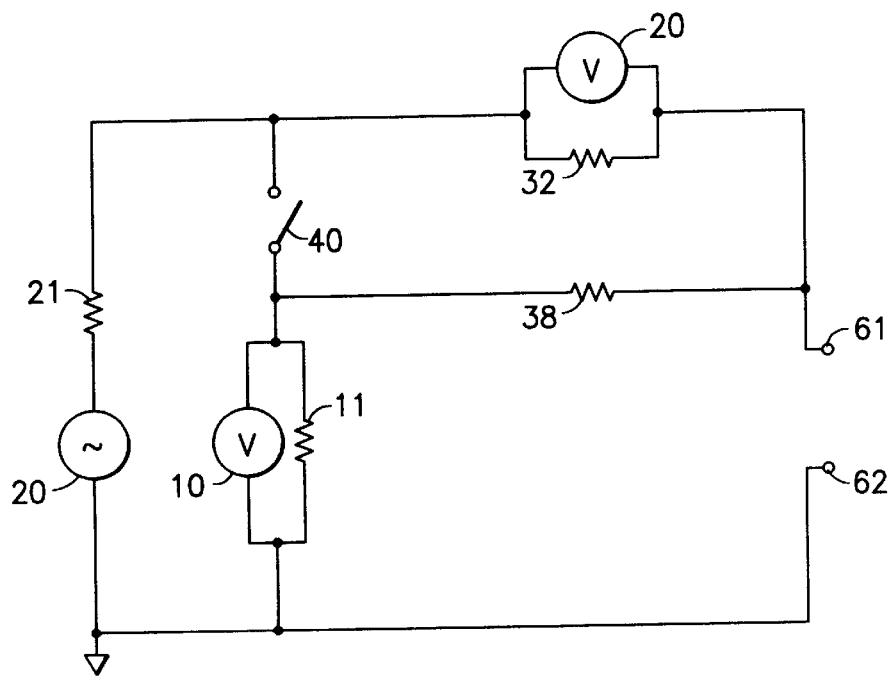
FIG. 6 illustrates the principles of an impedance meter that employs the voltmeter ammeter method.
Figure 7:
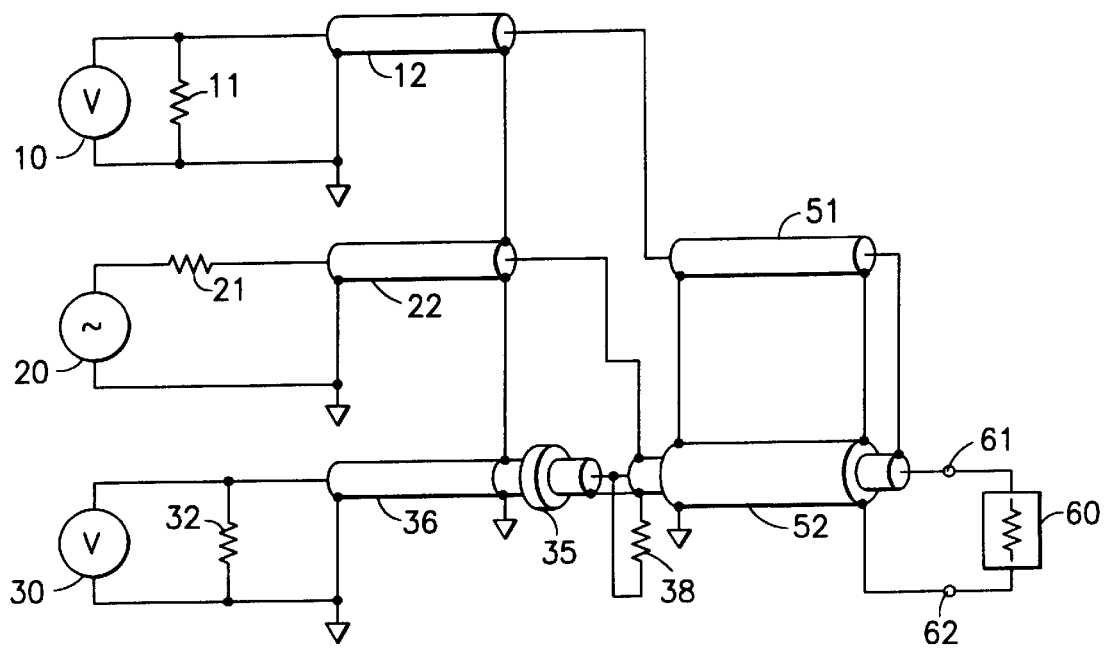
FIG. 7 illustrates an example of the cable extension type of an impedance meter of prior art.
Figure 8:
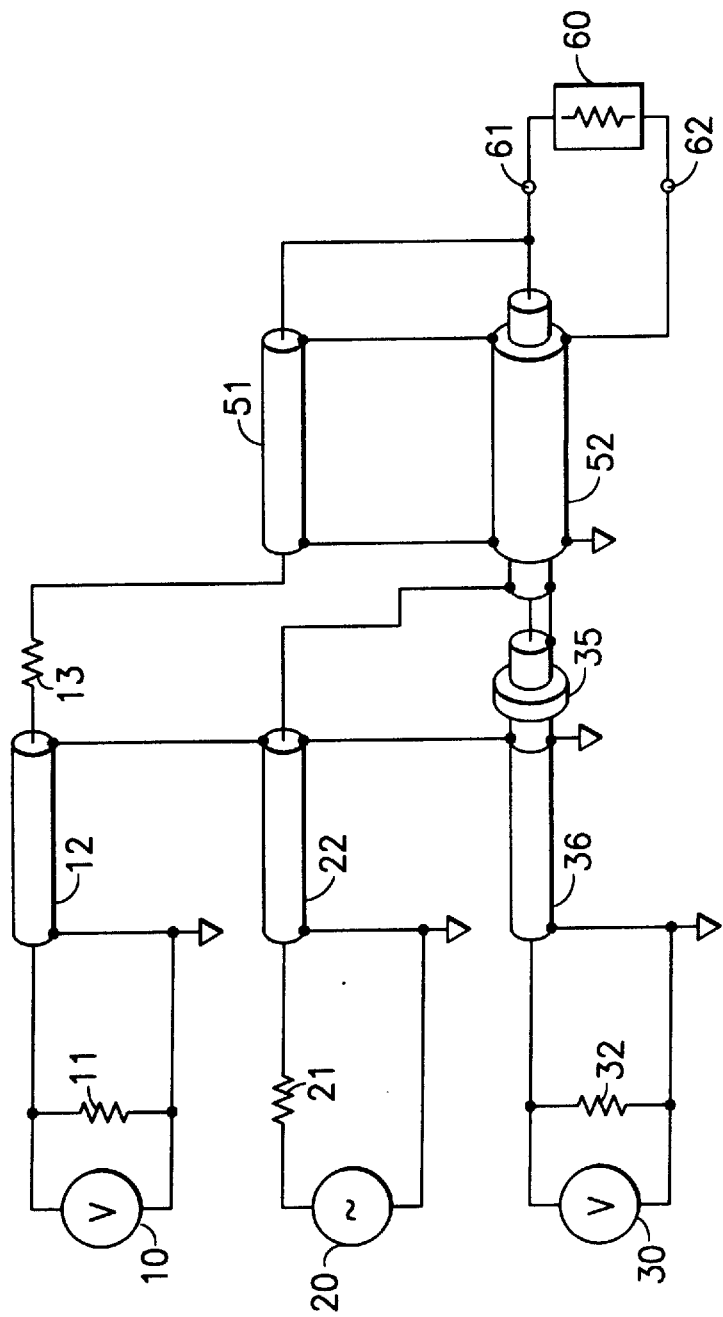
FIG. 8 illustrates an example of the cable extension type of an impedance meter of the prior art.
Figure 9:
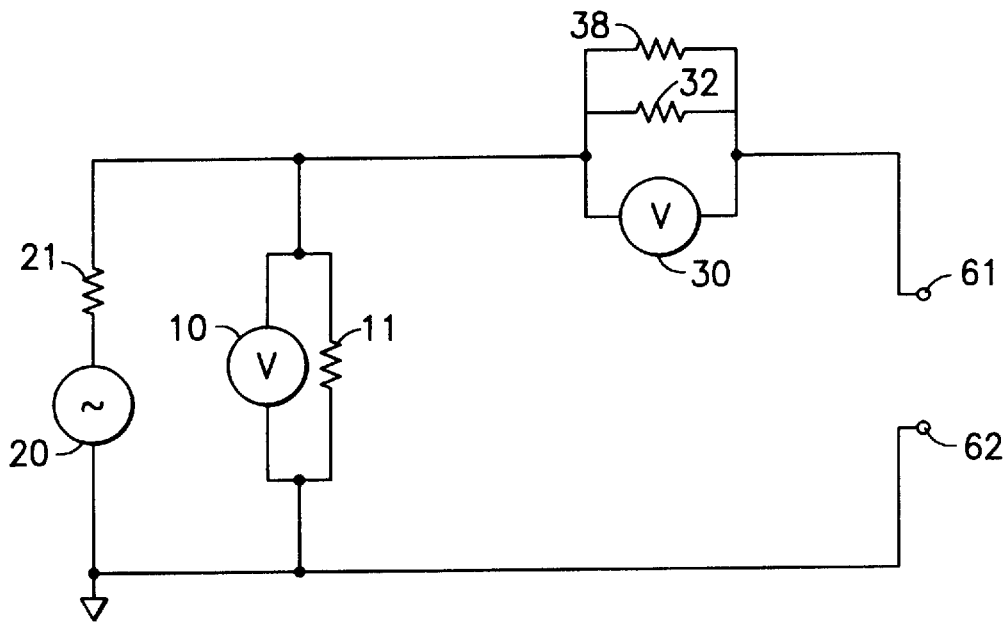
FIG. 9 illustrates an equivalent circuit for FIG. 7.
Figure 10:
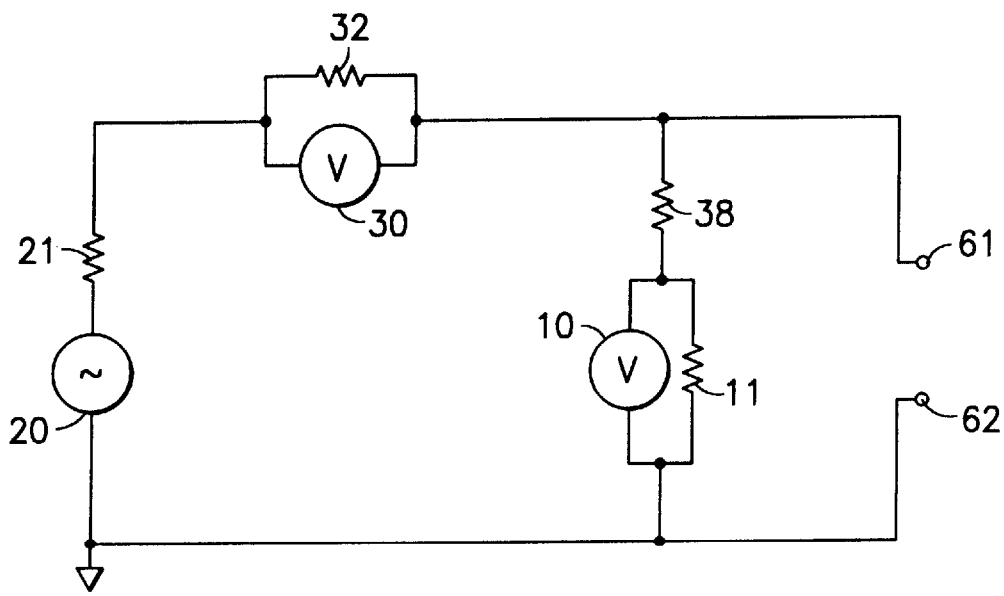
FIG. 10 illustrates an equivalent circuit for FIG. 8.
Figure 11:
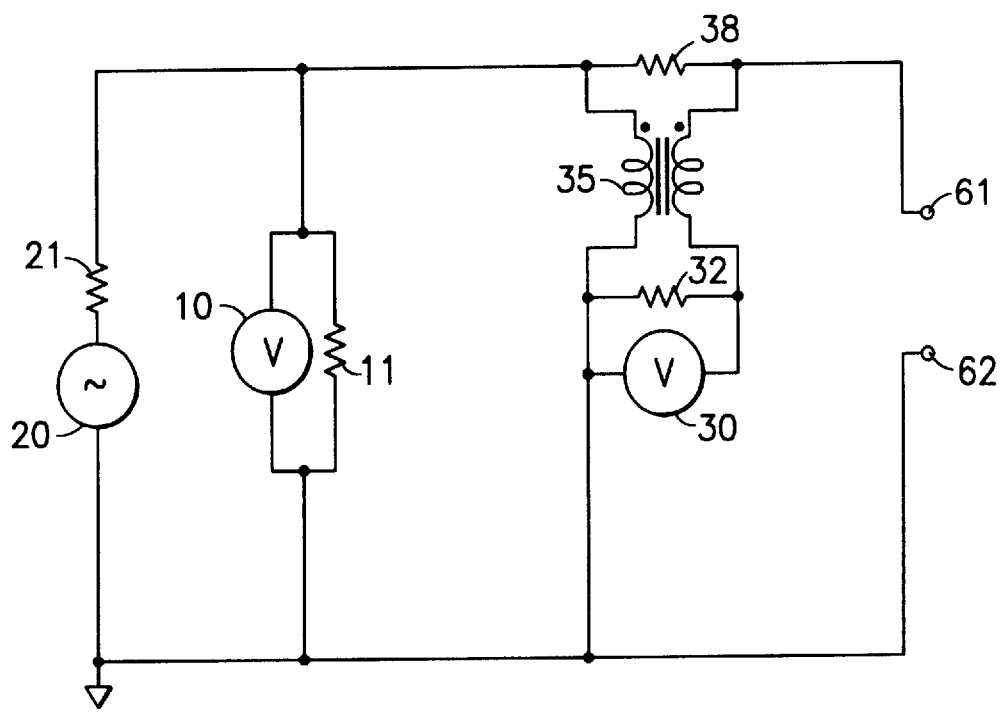
FIG. 11 illustrates an example of a floating type ammeter using a balun.
Figure 12:
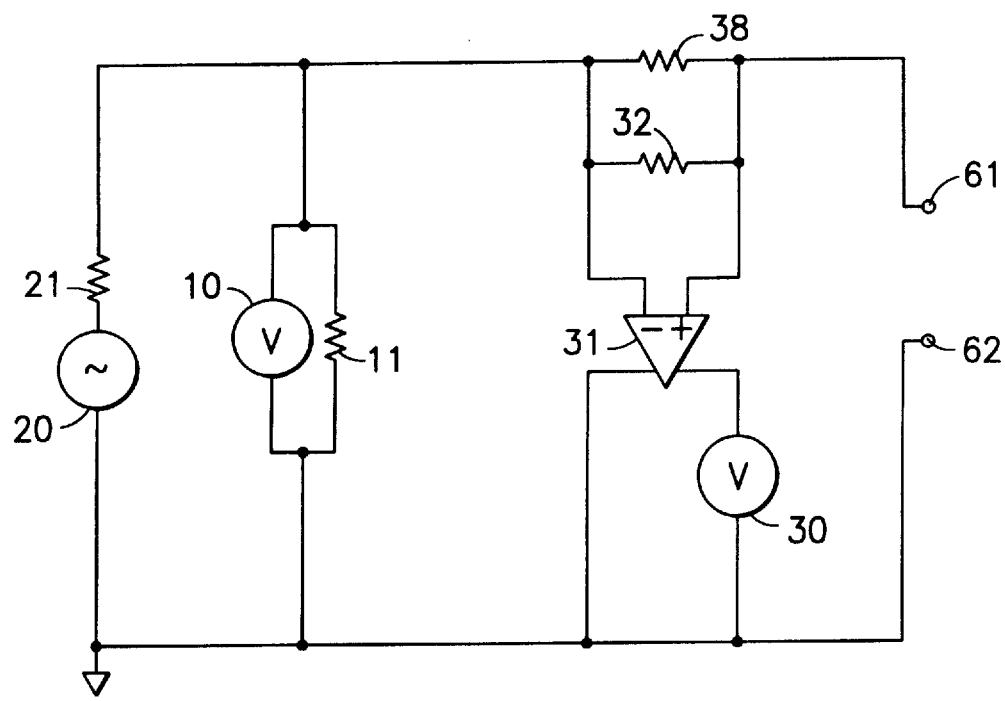
FIG. 12 illustrates an example of a floating type ammeter using a differential amplifier.
Figure 13:
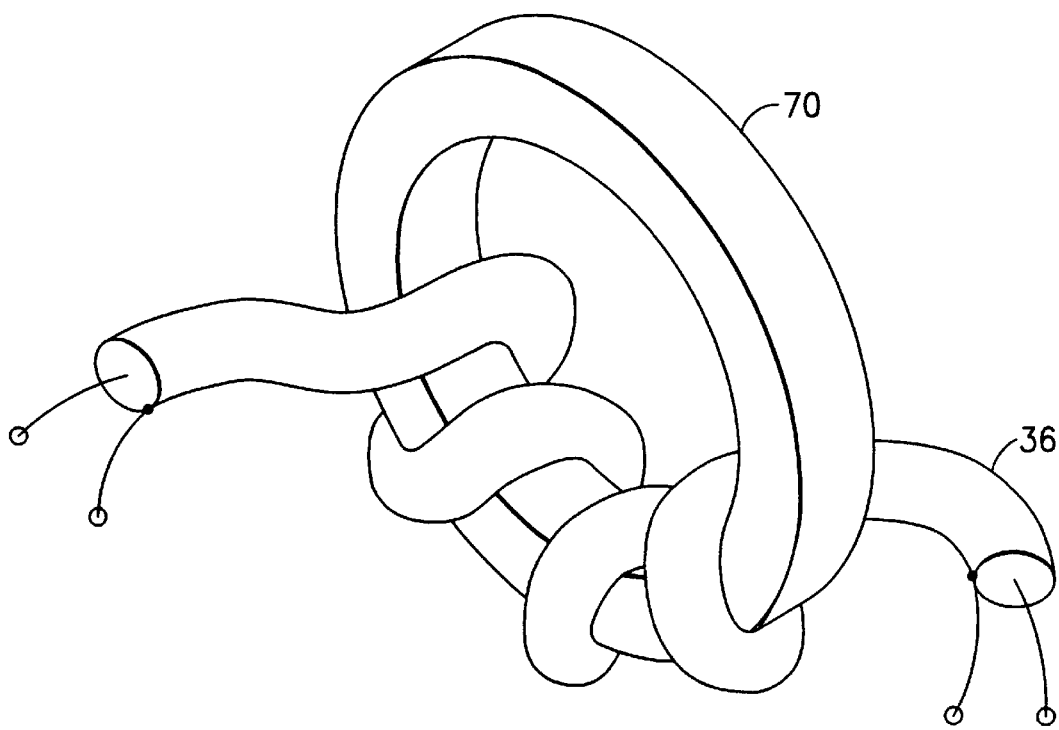
FIG. 13 illustrates an example of the design of a balun employing a coaxial cable.

As shown in FIGS. 5, 7, and 8, and the equivalent circuit of FIG. 11, in the prior art, the outer conductor of the cable on the output side of balun 35 is grounded. And, as shown in FIGS. 1 and 2, and the equivalent circuit of FIG. 4, in the first and second embodiments of the present invention, the outer conductor of the cable on the output side of balun 35, shown as node (b) in FIG. 4, is connected to ground, via a capacitor 33.

In the low frequency range capacitor 33 has a high impedance and, therefore, balun 35 does not short-circuit signal generator 20 even if the exciting impedance of balun 35 becomes low. The fact that the exciting impedance is low means that the common mode voltage is transferred unchanged to differential amplifier 31 such that the large common mode rejection effect of differential amplifier 31 will amplify only the differential voltage. The parallel resistors 32 and 38 form the current detection resistor, and the voltage across the resistors is the differential voltage. Voltmeter 30 measures the output of differential amplifier 31. Such an arrangement provides a floating type ammeter for the low frequency range.

On the other hand, in the high frequency range capacitor 33 has a low impedance and, therefore, the common connection point of balun 35, resistor 32, and capacitor 33, which is shown as node (b) in FIG. 4, is equivalently grounded. Such an arrangement is equivalent to the circuits shown in FIGS. 5, 7, and 8, and the equivalent circuit of FIG. 11.

Along the path that goes from node (a) through nodes (b) and (c) to node (d), the number of turns of balun 35 is equivalent to zero. Therefore, this is equivalent to having resistor 32 connected in parallel with resistor 38, via balun 35. That is to say, as in the case of the low frequency range, the current detection resistor is the parallel resistor of 32 and 38 in the case of the high frequency range.

In this way, only the voltage between the ends of the current detection resistor is amplified by differential amplifier 31 and measured by voltmeter 30. Such an arrangement provides a floating type ammeter for the high frequency range.

The boundary between the low frequency range and high frequency range will be described herein. The frequency at which the exciting impedance of balun 35 is equal to the impedance of capacitor 33 is referred to as the crossover frequency. The crossover frequency defines the boundary for using the common mode rejection effect of the balun 35 versus that of differential amplifier 31. At the crossover frequency, the exciting impedance of balun 35 and the impedance of capacitor 33 exhibit the greater load with respect to signal generator 20 over the entire frequency range. Therefore, their respective values are chosen so that the impedance of capacitor 33 and the exciting impedance of balun 35 are large at the crossover frequency, with respect to output resistor 21 of signal generator 20.

The purpose of resistor 37 is to dampen Q of the series resonance consisted of the exciting impedance of balun 35 and capacitor 33. If there is a large loss from the core of balun 35, there is no need for resistor 37. However, if Q is high, the transition characteristics at the crossover frequency would be poor. In other words, there is a large common mode voltage at the input terminal of differential amplifier 31 at this frequency as well as a large load on signal generator 20. Therefore, the value of resistor 37 is chosen to turn the resonance into a loss.

Figure 3:
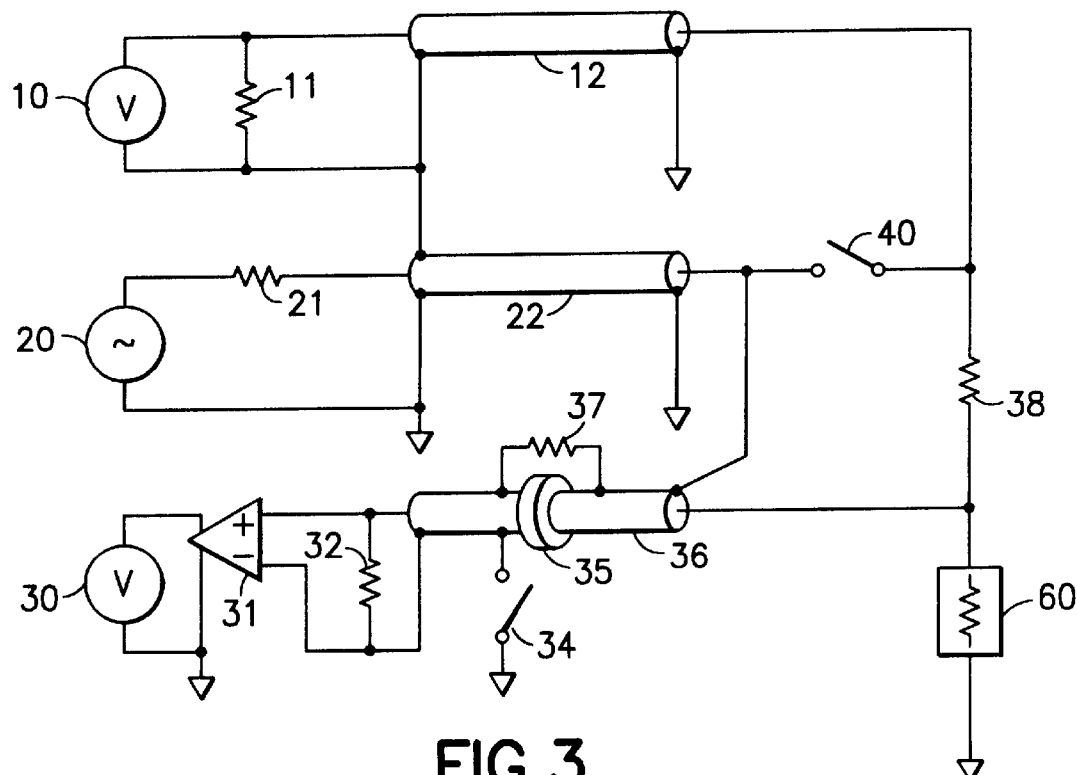
FIG. 3 illustrates a circuit diagram of a third embodiment of an impedance meter, in accordance with the present invention.

Note that it is possible to perform the function of capacitor 33 with a mechanical or semiconductor switch. As illustrated in FIG. 3, capacitor 33 can be replaced with a switch 34. Switch 34 is turned on or off at the crossover frequency to either utilize balun 35 or differential amplifier 31. A calculation/control block controls switch 34 depending on the specified measurement frequency.

Referring to U.S. Pat. Nos. 5,345,182 and 5,463,323, a circuit design that matches the characteristic impedance is appropriate for the present invention. If two such circuits are used in combination such that their respective signal generators may be alternately turned on and off, it is then possible to realize equipment for measuring the S parameter. Such 2-port measurement equipment achieves accurate measurement of S11 and S22 of DUT which have high input/output impedance, even the equipment exhibits 50 Ωas port impedance.

In FIG. 2, it is also possible to provide an external shield for coaxial cable 36 between the balun 35 and the resistor 32 in order to prevent external noise interference. The external shield may be incorporated without affecting the merits of this invention.

In summary, if the present invention is applied to the voltmeter-ammeter method disclosed in U.S. Pat. No. 5,463, 323 that made it possible to accurately perform remote measurements for a wide range of impedance values over a wide range of frequencies from 1 MHz to 1 GHz, then it is possible to extend the lower bound of the frequency to that of direct current without affecting the high frequency characteristics.

The invention having thus described with particular reference to the preferred forms thereof, it will be obvious that various changes and modifications may be made therein without departing from the spirit and scope of the invention as defined in the appended claims.

I claim:

1. A meter for measuring a current by measuring a voltage across a current detection resistor over a broad frequency range, said meter comprising:

a balun including a coaxial cable, having a central conductor and an outer conductor, an input side and an output side;

a differential amplifier having one input terminal coupled to said central conductor of said coaxial cable on said output side of said balun and another input terminal coupled to said outer conductor of said coaxial cable;

a current detection resistor coupled between said central conductor and said outer conductor of said balun;

a voltmeter for measuring an output voltage of said differential amplifier to determine a current flowing through said current detection resistor; and grounding means:
  (i) responsive to a current in a high frequency range, for providing a low impedance connection between said outer conductor of said coaxial cable and a ground, and
  (ii) responsive to said current in a low frequency range, for providing a high impedance connection between said outer conductor of said coaxial cable and said ground.

2. A meter as recited in claim 1, wherein said current detection resistor is connected between said central conductor and said outer conductor on said input side of said balun.

3. A meter as recited in claim 1, wherein said current detection resistor is connected between said central conductor and said outer conductor on said output side of said balun.

4. A meter as recited in claim 1, wherein said current detection resistor comprises a primary and secondary resistor, each resistor having an impedance equal to a characteristic impedance of said coaxial cable, said primary resistor being coupled between said central conductor and said outer conductor on said input side of said balun, said secondary resistor being coupled between said central conductor and said outer conductor on said output side of said balun.

5. A meter as recited in claim 1, wherein said grounding means includes a capacitor, coupled between said ground and said outer conductor.

6. A meter as recited in claim 1, wherein said grounding means includes a switch, coupled between said outer conductor and said ground.

7. A meter as recited in claim 5, further comprising a resistor, coupled between said input and output sides of said balun on said outer conductor of said coaxial cable.

8. A meter as recited in claim 1, wherein said coaxial cables includes an external shield on said output side of said balun.

9. An impedance meter for measuring an impedance of a device under test, said impedance meter comprising:

an ammeter including:

a balun including a coaxial cable, having a central conductor and an outer conductor, and an input side and an output side;

a differential amplifier having one input terminal coupled to said central conductor of said coaxial cable on said output side of said balun and another input terminal coupled to said outer conductor of said coaxial cable;

a current detection resistor coupled between said central conductor and said outer conductor of said balun;

a voltmeter for measuring an output voltage of said differential amplifier to determine a current flowing through said current detection resistor; and grounding means:
(i) responsive to a current in the high frequency range, for providing a low impedance connection between said outer conductor of said coaxial cable and a ground, and
(ii) responsive to said current in a low frequency range, for providing a high impedance connection between said outer conductor of said coaxial cable and said ground.

10. An impedance meter as recited in claim 9, wherein said current detection resistor is connected between said central conductor and said outer conductor on said input side of said balun.

11. An impedance meter as recited in claim 9, wherein said current detection resistor is connected between said central conductor and said outer conductor on said output side of said balun.

12. An impedance meter as recited in claim 9, wherein said current detection resistor comprises a primary and secondary resistor, each resistor having an impedance equal to a characteristic impedance of said coaxial cable, said primary resistor being coupled between said central conductor and said outer conductor on said input side of said balun, said secondary resistor being coupled between said central conductor and said outer conductor on said output side of said balun.

* * * * *